US009048891B2

(12) United States Patent
Mielczarek et al.

(10) Patent No.: US 9,048,891 B2
(45) Date of Patent: *Jun. 2, 2015

(54) MULTI-TIERED QUANTIZATION OF CHANNEL STATE INFORMATION IN MULTIPLE ANTENNA SYSTEMS

(75) Inventors: Bartosz Mielczarek, Edmonton (CA); Witold A. Krzymien, Edmonton (CA)

(73) Assignee: Wi-LAN Inc., Ottawa, Ontario (CA)

(*) Notice: Subject to any disclaimer, the term of this patent is extended or adjusted under 35 U.S.C. 154(b) by 492 days.

This patent is subject to a terminal disclaimer.

(21) Appl. No.: 13/083,375

(22) Filed: Apr. 8, 2011

(65) Prior Publication Data

US 2011/0274182 A1  Nov. 10, 2011

Related U.S. Application Data

(63) Continuation of application No. 11/852,240, filed on Sep. 7, 2007, now Pat. No. 8,036,282.

(51) Int. Cl.
| | | |
|---|---|---|
| H04L 1/02 | (2006.01) | |
| H04B 7/02 | (2006.01) | |
| H04B 7/04 | (2006.01) | |
| H03M 13/47 | (2006.01) | |
| H03M 13/00 | (2006.01) | |
| H04B 7/06 | (2006.01) | |
| H04L 1/20 | (2006.01) | |

(52) U.S. Cl.
CPC .............. *H04B 7/0417* (2013.01); *H03M 13/47* (2013.01); *H03M 13/612* (2013.01); *H04B 7/0626* (2013.01); *H04B 7/0639* (2013.01); *H04B 7/0663* (2013.01); *H04L 1/20* (2013.01); *H04B 7/0658* (2013.01)

(58) Field of Classification Search
CPC ....... H04L 1/06; H04L 1/0618; H04L 1/0003; H04L 1/0071; H04L 27/2647; H04B 7/0669
USPC ............ 375/267, 299, 347; 370/334; 455/101
See application file for complete search history.

(56) References Cited

U.S. PATENT DOCUMENTS

| | | |
|---|---|---|
| 5,706,312 A | 1/1998 | Wei |
| 5,790,676 A | 8/1998 | Ganesan |

(Continued)

FOREIGN PATENT DOCUMENTS

| | | |
|---|---|---|
| CA | 2 548 919 A1 | 6/2005 |
| CN | 101136718 A | 3/2008 |

(Continued)

OTHER PUBLICATIONS

Balachandran, K., et al., "Channel Quality Estimation and Rate Adaptation for Cellular Mobile Radio," IEEE Journal on Selected Areas in Communication 17(7):1244-1256, Jul. 1999.

(Continued)

*Primary Examiner* — Ted Wang
(74) *Attorney, Agent, or Firm* — Volpe and Koenig, P.C.

(57) ABSTRACT

A multi-tiered CSI vector quantizer (VQ) is provided for time-correlated channels. The VQ operates by quantizing channel state information by reference to both the current channel state information and a prior channel state quantization. A system is also provided that uses multi-tiered CSI quantizers. Enhanced signaling between the transmitter and receivers is provided in order to facilitate the use of multi-tiered CSI quantizers.

34 Claims, 7 Drawing Sheets

(56) References Cited

U.S. PATENT DOCUMENTS

| | | | |
|---|---|---|---|
| 7,333,556 | B2 | 2/2008 | Maltsev |
| 7,489,664 | B2 | 2/2009 | Kim et al. |
| 7,570,627 | B2 | 8/2009 | Welborn |
| 7,587,172 | B2 | 9/2009 | Kim et al. |
| 7,599,714 | B2 | 10/2009 | Kuzminskiy |
| 7,676,007 | B1 | 3/2010 | Choi et al. |
| 7,702,029 | B2 | 4/2010 | Kotecha |
| 2003/0012290 | A1 | 1/2003 | Fimoff |
| 2003/0017835 | A1 | 1/2003 | Bergel |
| 2003/0144032 | A1 | 7/2003 | Brunner |
| 2004/0057394 | A1 | 3/2004 | Holtzman |
| 2004/0190636 | A1 | 9/2004 | Oprea |
| 2004/0259555 | A1 | 12/2004 | Rappaport |
| 2005/0195912 | A1 | 9/2005 | Kim |
| 2005/0259764 | A1 | 11/2005 | Hung Lai |
| 2005/0286618 | A1 | 12/2005 | Abe |
| 2005/0286663 | A1 | 12/2005 | Poon |
| 2006/0008021 | A1 | 1/2006 | Bonnet |
| 2006/0034165 | A1 | 2/2006 | Levy |
| 2006/0039489 | A1 | 2/2006 | Ikram |
| 2006/0111148 | A1 | 5/2006 | Mukkavilli |
| 2006/0155534 | A1 | 7/2006 | Lin |
| 2006/0165008 | A1 | 7/2006 | Li |
| 2006/0215780 | A1 | 9/2006 | Yeon |
| 2006/0233265 | A1* | 10/2006 | Rajan et al. .................. 375/259 |
| 2006/0268623 | A1 | 11/2006 | Chae |
| 2007/0064780 | A1 | 3/2007 | Zheng et al. |
| 2007/0104283 | A1 | 5/2007 | Han et al. |
| 2007/0120670 | A1 | 5/2007 | Torchalski |
| 2007/0153731 | A1* | 7/2007 | Fine .............................. 370/329 |
| 2007/0254602 | A1 | 11/2007 | Li et al. |
| 2008/0037669 | A1 | 2/2008 | Pan et al. |
| 2008/0080449 | A1 | 4/2008 | Huang |
| 2008/0080459 | A1 | 4/2008 | Kotecha |
| 2008/0084943 | A1 | 4/2008 | Jung |
| 2008/0086669 | A1 | 4/2008 | Cheng et al. |
| 2008/0101321 | A1 | 5/2008 | Cheng et al. |
| 2008/0165875 | A1 | 7/2008 | Mundarath et al. |
| 2008/0192717 | A1* | 8/2008 | Kent et al. ..................... 370/342 |
| 2008/0219369 | A1 | 9/2008 | Wu |
| 2008/0232274 | A1 | 9/2008 | Grover |
| 2008/0268862 | A1 | 10/2008 | Kent et al. |
| 2008/0285670 | A1 | 11/2008 | Walton |
| 2009/0067512 | A1 | 3/2009 | Mielczarek |
| 2009/0067529 | A1 | 3/2009 | Mielczarek |
| 2009/0201861 | A1 | 8/2009 | Kotecha |
| 2009/0265601 | A1 | 10/2009 | Mielczarek |
| 2009/0274230 | A1 | 11/2009 | Heath, Jr. |
| 2010/0046666 | A1 | 2/2010 | Ketchum |
| 2010/0150036 | A1 | 6/2010 | Zheng |
| 2010/0266054 | A1 | 10/2010 | Mielczarek |
| 2010/0322336 | A1 | 12/2010 | Nabar |
| 2012/0057643 | A1 | 3/2012 | Lin |
| 2014/0064415 | A1 | 3/2014 | Hultell et al. |
| 2014/0126663 | A1 | 5/2014 | Cheng et al. |

FOREIGN PATENT DOCUMENTS

| | | | |
|---|---|---|---|
| WO | 2005/057812 | A1 | 6/2005 |
| WO | 2005/081439 | A1 | 9/2005 |
| WO | 2005/125044 | A1 | 12/2005 |
| WO | 2007007249 | A2 | 1/2007 |
| WO | 2007/066936 | A2 | 6/2007 |
| WO | 2007094832 | A2 | 8/2007 |

OTHER PUBLICATIONS

Bulumulla, S.B., et al., "A Systemic Approach to Detecting OFDM Signals in a Fading Channel," IEEE Transactions on Communications 48(5):725-728, May 2000.

Caire, G., et al., "Multiuser MIMO Achievable Rates With Downlink Training and Channel State Feedback," IEEE Transactions on Information Theory 56(6):2845-2866, Jun. 2010.

Jindal, N., "MIMO Broadcast Channels With Digital Channel Feedback," 40th Asilomar Conference on Signals, Systems and Computers (ACSSC '06), Pacific Grove, Calif., Oct. 29-Nov. 1, 2006, pp. 1506-1510.

Mielczarek, B., and W. Krzymień, "Flexible Channel Feedback Quantization in Multiple Antenna Systems," IEEE 61st Vehicular Technology Conference (VTC 2005-Spring), Stockholm, May 30-Jun. 1, 2005, vol. 1, pp. 620-624.

Mielczarek, B., and W.A. Krzymień, "Influence of CSI Feedback Delay on Capacity of Linear Multi-User MIMO Systems," IEEE Wireless Communications and Networking Conference (WCNC 2007), Hong Kong, Mar. 11-15, 2007, pp. 1188-1192.

Mielczarek, B., and W.A. Krzymień, "Influence of CSI Feedback Errors on Capacity of Linear Multi-User MIMO Systems," IEEE 65th Vehicular Technology Conference (VTC 2007-Spring), Dublin, Ireland, Apr. 22-25, 2007, pp. 2043-2047.

Mielczarek, B., and W.A. Krzymień, "Vector Quantized CSI Prediction in Linear Multi-User MIMO Systems," IEEE 67th Vehicular Technology Conference (VTC Spring-2008), Singapore, May 11-14, 2008, pp. 852-857.

Mielczarek, B., and W.A. Krzymień, "Vector Quantization of Channel Information in Linear Multi-User MIMO Systems," IEEE Ninth International Symposium on Spread Spectrum Techniques and Applications (ISSSTA 2006), Manaus, Brazil, Aug. 28-31, 2006, pp. 302-306.

Raghavan, V., et al., "Systematic Codebook Designs for Quantized Beamforming in Correlated MIMO Channels," IEEE Journal on Selected Areas in Communication 25(7):1298-1310, Sep. 2007.

Ravindran, N., and N. Jindal, "MIMO Broadcast Channels With Block Diagonalization and Finite Rate Feedback," IEEE International Conference on Acoustics, Speech and Signal Processing (ICASSP 2007), Honolulu, Apr. 15-20, 2007, pp. III-13-III-16.

Roh, J.C., and B.D. Rao, "Channel Feedback Quantization Methods for MISO and MIMO Systems," 15th IEEE International Symposium on Personal, Indoor and Mobile Radio Communications (PIMRC 2004), Barcelona, Sep. 5-8, 2004, vol. 2, pp. 805-809.

Sadrabadi, M.A., et al., "A New Method of Channel Feedback Quantization for High Data Rate MIMO Systems," IEEE Global Telecommunications Conference (Globecom 2004), Dallas, Nov. 3-Dec. 3, 2004, vol. 1, pp. 91-95.

Sadrabadi, M.A., et al., "A New Method of Channel Feedback Quantization for High Data Rate MIMO Systems," Technical Report UW-E&CE#2004-05, Coding & Signal Transmission Laboratory, Dept. of Electrical & Computer Engineering, University of Waterloo, Waterloo, Canada, Mar. 20, 2004, 23 pages.

Zorzi, M., and R.R. Rao, "Lateness Probability of a Retransmission Scheme for Error Control on a Two-State Markov Channel," IEEE Transactions on Communications 47(10):1537-1548, Oct. 1999.

Larsson et al, "Off-line dictionary-based compression," Proceedings of the IEEE, vol. 88, Issue 11, pp. 1722-1732 (Nov. 2000).

Li et al, "Test Data Compression Using Dictionaries with Fixed-Length Indices," Proceedings of the VLSI Test Symposium (Apr. 27-May 1, 2003).

Ravindran et al., "MIMO Broadcast Channels with Block Diagonalization and Finite Rate Feedback," Computing Research Repository—CORR, arXiv:cs/0610077v1, 4 pages (Oct. 2006).

IEEE Standard for Local and metropolitan area networks; Part 16: Air Interface for Fixed Broadband Wireless Access Systems, IEEE Std 802.16/2004 (Oct. 1, 2004).

IEEE Standard for Local and metropolitan area networks; Part 16: Air Interface for Fixed and Mobile Broadband Wireless Access Systems; Amendment 2: Physical and Medium Access Control Layers for Combined Fixed and Mobile Operation in Licensed Bands and Corrigendum 1, IEEE Std 802.16e-2005 and IEEE Std 802.16-2004/Cor1-2005 (Feb. 28, 2006).

* cited by examiner

MULTI-TIERED QUANTIZATION OF CHANNEL STATE INFORMATION IN MULTIPLE ANTENNA SYSTEMS

BACKGROUND

One of the most promising solutions for increased spectral efficiency in high capacity wireless systems is the use of multiple antennas on fading channels. The fundamental issue in such systems is the availability of the channel state information (CSI) at transmitters and receivers. In general, if the receivers and transmitter have an access to CSI, the system throughput can be significantly increased. While it is usually assumed that perfect CSI is available at the receivers, the transmitter may only have partial CSI available due to the feedback delay and noise, channel estimation errors and limited feedback bandwidth, which forces CSI to be quantized at the receiver to minimize feedback rate. There is described here an improvement in the quantization of channel state information in a multiple antenna system.

SUMMARY

A multi-tiered CSI vector quantizer (VQ) is provided for time-correlated channels. The VQ operates for example by quantizing channel state information by reference to both current channel state information and a prior channel state quantization. A system is also provided that uses multi-tiered CSI quantizers. Enhanced signaling between the transmitter and receivers is provided in order to facilitate the use of multi-tiered CSI quantizers. These and other aspects of the device and method are set out in the claims, which are incorporated here by reference.

BRIEF DESCRIPTION OF THE FIGURES

Embodiments will now be described with reference to the figures, in which like reference characters denote like elements, by way of example, and in which.

DETAILED DESCRIPTION

Figure 4:
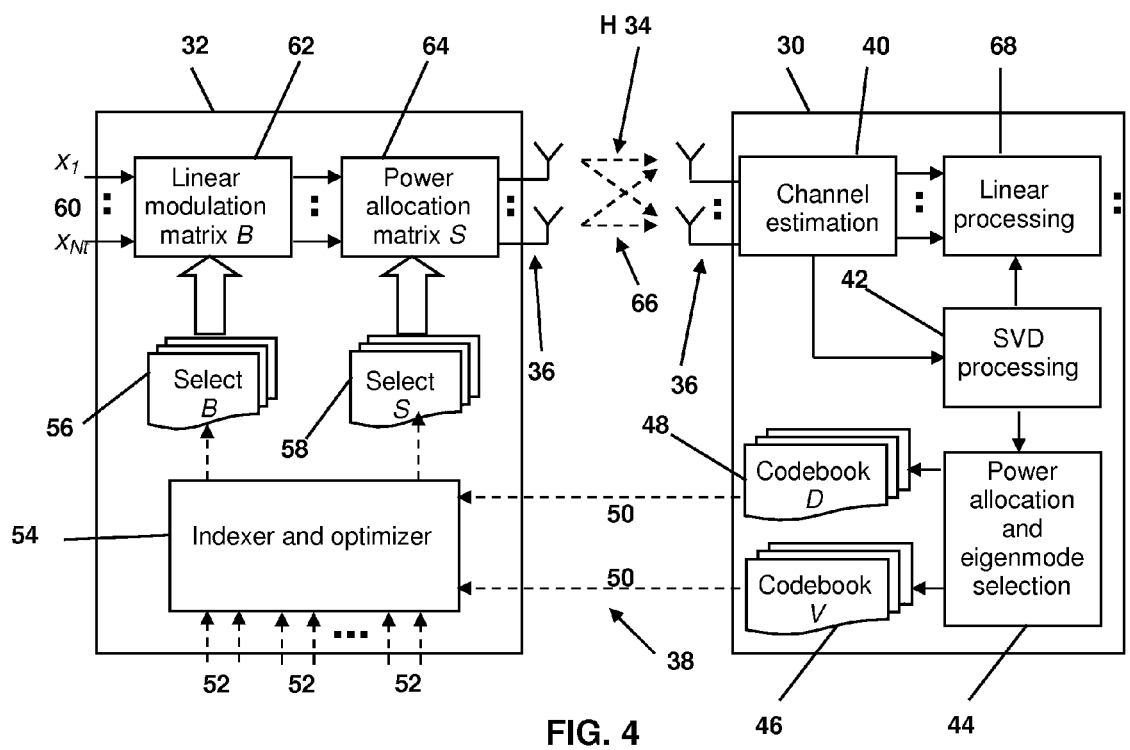
FIG. 4 shows the structure of a quantization system.

In a multiple antenna system as for example shown in FIG. 4, information is transmitted over multiple channels 34 corresponding to multiple antennas 36. Each channel 34 has a state that affects the propagation of information over the channel. The state of multiple channels 34 between a transmitter 32 and one or more receivers 30 in a multiple antenna system can be expressed as a vector. As the channel state changes, this vector moves through the channel vector space. The channel vector space may be separated into regions (see FIG. 1). Each region may be represented by an index. If each region corresponds to the part of the space closest, by some metric, to a particular member of a set of points in the space, then the regions are known as Voronoi regions 20 and the points are known as centroids 22. In order to maximize throughput, it is preferred to associate each index to a centroid 22, which represents the Voronoi region 20 which is the part of space closer to that centroid 22 than any other.

A vector quantizer (VQ) with multi-tiered quantization is aimed at transmission channels with memory, in which there is a need to reduce the feedback bandwidth and allow the system to automatically adjust the quantizer resolution to the rate of channel changes. In an exemplary design of a multi-tiered CSI vector quantizer (i.e., the description of centroids and Voronoi regions) for multiple-input, multiple-output (MIMO) channels with memory, the VQ uses multiple optimization steps.

Figure 1:
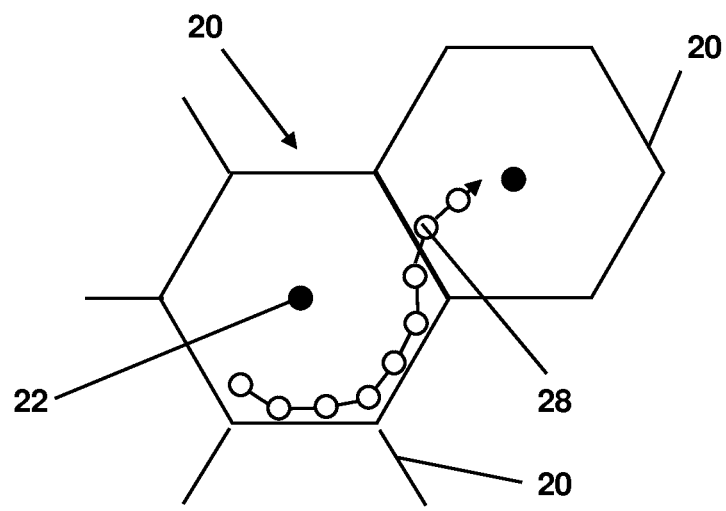
FIG. 1 is an illustration of a channel vector space according to known principles in the art.

In the typical CSI VQ, the quantization of the channel vector space can be illustrated as in FIG. 1: the CSI space is tessellated by Voronoi regions 20 with corresponding centroids 22 that represent all vector realizations within each Voronoi region (for each centroid, the corresponding Voronoi region is the set of points closer to that centroid than any other, according to some metric). The number of such regions (centroids) is defined by the number of available bits, which also influence the quantization error of the VQ. FIG. 1 shows the situation when the channel CSI is correlated in time and follows some trajectory 28 in time.

Figure 2:
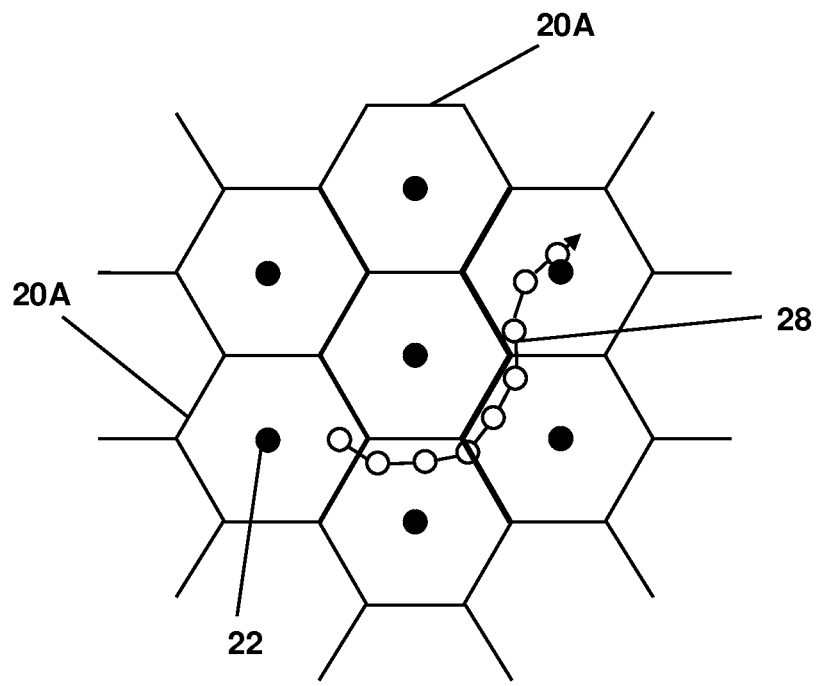
FIG. 2 is an illustration of the channel vector space of FIG. 1 with a more fine-grained quantization.

The quantization error can be decreased if the CSI VQ resolution is increased using more bits in feedback link. FIG. 2 shows the identical trajectory 28 of the channel vector realization as in FIG. 1 with increased number of centroids 22 and Voronoi regions 20A. In FIG. 1 only two different centroid indices would be used to represent the channel trajectory, whereas in FIG. 2, four such indices would be used, which would result in more precise representation of the actual channel changes. The price for such improvement is a larger number of bits needed to characterize the quantized CSI indices that must be fed back to the transmitter.

The typical trajectory 28 of CSI vectors is partially predictable in a sense that the channel realizations between consecutive transmission epochs within the same frequency band are correlated. The correlation increases with decreasing relative speeds of receiver-transmitter pairs with the net effect of trajectories being statistically contained within a given Voronoi region for a predictable amount of time. The time metrics may be quantitative described in various ways such as using time metrics called eigenmode coherence time and singular value coherence time. In CSI VQ context, the longer the coherence time, the less frequent the changes in VQ indices that need to be reported back to the transmitter.

A multi-tiered VQ allows for a significant reduction of the feedback rate for systems in which channel coherence times are fairly long. During the design of the quantizer, the Voronoi regions are optimized according to any chosen criterion in 2, 3, 4 and more tiers, in which consecutive Voronoi regions are embedded in the previous ones as shown for example in FIG. 3 for a 2-tiered design.

Figure 3:
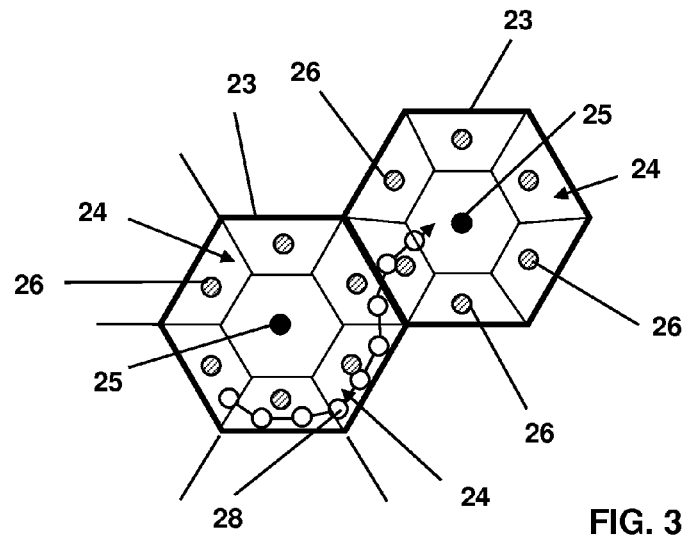
FIG. 3 is an illustration of the channel vector space of FIG. 2 with a multi-tier quantization.

In the example of FIG. 3, a 2-tiered CSI VQ is divided into primary 23 and secondary 24 Voronoi regions and corresponding centroids 25, 26. In the first phase of the VQ operation, only the primary regions are used to assign the primary centroid indices to the channel vectors. In the second phase, only the secondary centroids and the primary centroid within the first identified primary region are reported to the base station until the channel vector realization leaves the primary region. In this way, as long as the channel vector does not change very rapidly, high quantization resolution can be obtained at much lower feedback rate as the quantization points are concentrated within a space of single primary Voronoi region. Moreover, this mechanism allows the receiver to automatically adjust the vector resolution to the rate of channel changes. The transmitter and receiver must have a way of identifying for which Voronoi regions (primary, secondary etc.) the VQ indices are reported.

The following notation is used in describing an exemplary multi-tiered VQ:

M—the number of tiers in the CSI vector quantizer design $m_k$—the current tier index at receiver k $m^k$—the current base station tier index of receiver k $N_m$—the number of bits for CSI representation at each tier of the CSI MIMO VQ.

A system using a dual VQ codebook design for quantization of channel state information in a multiple antenna system is shown in FIG. 4. This example shows a system according to the inventors' U.S. patent application Ser. No. 11/754,965 filed May 29, 2007. A multi-tiered VQ may be used for eigenmode and singular value codebooks in systems ranging from only one active receiver at a time to systems with multiple receivers being active simultaneously (where we define being active as receiving transmissions). The design of the multi-tiered codebooks can be applied to matrices of orthogonal eigenmodes, subsets of eigenmodes and scalar singular values as necessary. The following descriptions may be applied to any type of CSI quantizing solution.

In FIG. 4, a transmitter 32 communicates with a receiver 30 over a feedforward channel 66 and a feedback channel 38 using antennas 36. The receiver 30 includes a channel estimator 40, linear processor 68 for decoding a transmission, a singular value processing unit 42, a power allocation and eigenmode selector 44, and codebooks 48 and 46. The receiver 30 may use various known electronic processors for its parts, and in one embodiment may use a monolithic application specific chip. The functions of the receiver 30 may be provided partly or entirely by hardware, firmware and/or software. The transmitter 32 includes an indexer and optimizer 54 and stored modulation and power allocation matrices 56 and 58 respectively. An input data stream 60 is fed to a modulator 62 that applies a linear modulation matrix selected from the stored modulation matrices 56. The modulated data stream is fed to a power allocator 64, which applies a power allocation matrix selected from the stored power allocation matrices 58. The system of FIG. 4 works as follows:

1. Before the transmission epoch, each receiver 30 estimates 40 its channel matrix H 34 for the feedforward channel 66 and uses this information to perform 42 the singular value decomposition (SVD) of the matrix.
2. The eigenmode and singular value (power allocation) components are separately quantized 44 using two codebooks V 46 and D 48, respectively.
3. The indices 50 of the selected codewords are fed back to the transmitter using a feedback channel 38.
4. The transmitter uses all the indices from all receivers 50, 52 in the system to choose 56, 58 the pre-computed linear modulation and power allocation matrices B 62, 64 and S, respectively. The choice is based on a pre-defined set of rules (maximum throughput, fairness, etc.).
5. The signal ($x_1$ to $x_{N_T}$) 60 is modulated using the selected linear modulation and power allocation matrices B 62 and S 64 and transmitted via the feedforward channel 66.
6. The transmitted modulated signal is processed by the receiver 68.

The transmitter 32 thus has a processor configured to carry out the above steps 4-5 and each receiver has one or more antennas 36 and a processor configured to carry out steps 1-3 and 6.

Figure 5:
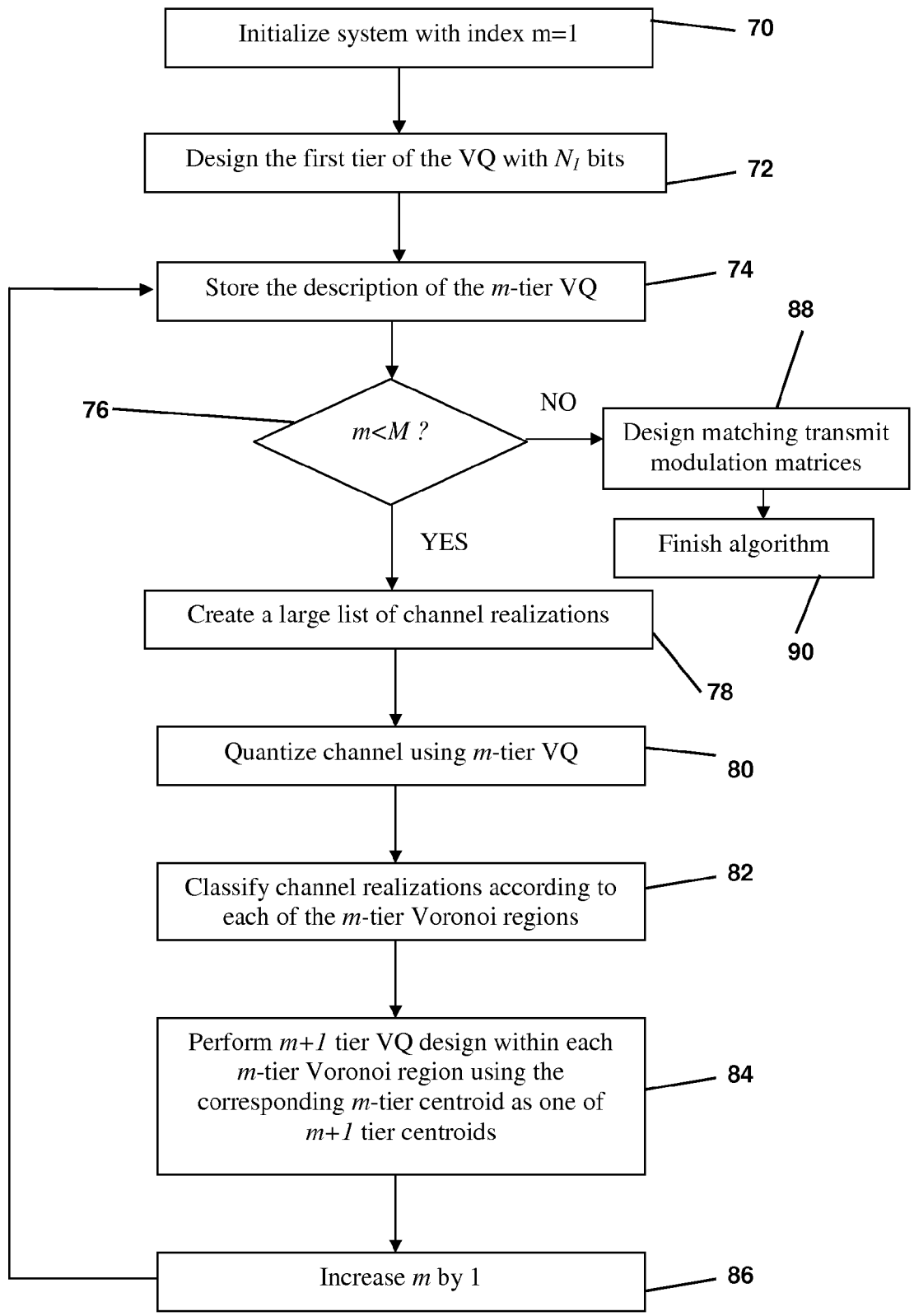
FIG. 5 shows the operation of an algorithm for designing a multi-tiered quantizer.

Referring to FIG. 5, design of the multi-tiered codebooks (D or V) is performed as follows:

1. Based on the desired system parameters (types of channels, required feedback rate required performance etc.) set parameters M and $N_m$, for each value of m=1, 2, . . . , M.
2. Set m=1 (step 70).
3. Any of various vector quantizers may be used to design a receiver VQ using $N_1$ resolution bits (step 72). An example is given below, from U.S. patent application Ser. No. 11/754,965, which is entitled "Quantization of Channel State Information in Multiple Antenna Systems".
4. Store the description of the Voronoi regions and centroids for m-tier of the VQ (step 74).
5. If m is smaller than M (step 76), continue the design in the following way:
    a) Create a large list of possible channel realizations (step 78).
    b) Using the m-tier VQ, quantize (step 80) the above channel realizations.
    c) Select channel realizations corresponding to each of the m-tier VQ indices (step 82).
    d) Within each of the m-tier Voronoi regions, perform m+1 tier design of a vector quantizer using any of various VQ designs, such as in U.S. patent application Ser. No. 11/754,965 and shown below. The algorithm uses $N_{m+1}$ resolution bits within each region and forces one of the tier m+1 centroids within each region to be identical to the m-tier centroid corresponding to this region (step 84). The codebook entries of the new codebook for each region are now considered to be the group of tier m+1 entries associated with the tier m codebook entry for that region.
    e) The reused m-tier centroid is assigned $N_{m+1}$ index bits equal to 0.
    f) Increase m by 1 (step 86).
    g) Go to step 4.
6. If m≥M, finish the VQ design (step 76).
7. Design the modulation matrices corresponding to the designed multi-tiered VQ using any of various modulation matrix design techniques such as the algorithm shown in U.S. patent application Ser. No. 11/754,965, as shown below (step 88). The algorithm is now done (step 90).

Figure 6:
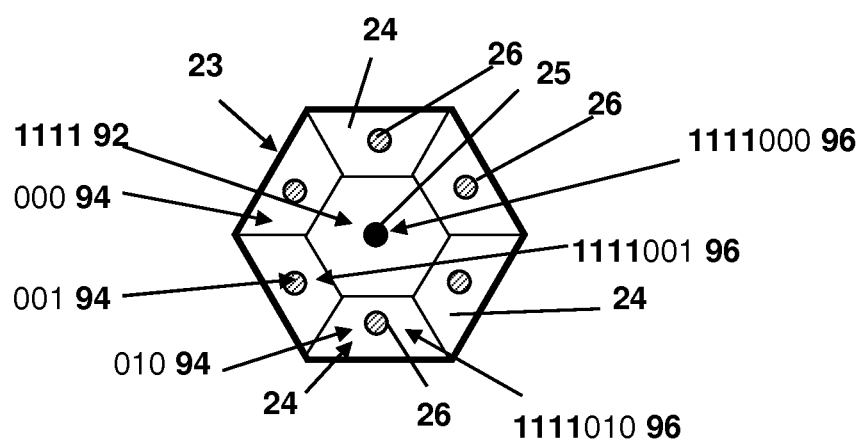
FIG. 6 shows a region of one codebook and the corresponding regions of the corresponding next higher tier codebook for use in a multi-tiered quantizer.

The rationale behind re-using one of the m tier centroids at design phase of (m+1)-tier centroids and Voronoi regions (see bullet 5d above) is that the same set of modulation matrices can be used in a system where different users report their quantized channel information using different VQ tiers. As all m-tier centroids are contained in (m+1)-tier centroids, the effective indices can be easily used to decide which centroid must be used. FIG. 6 shows an example: a single primary region with index 1111 92 and secondary regions with indices of 000, 001, etc 94 thus giving them effective indices of 1111000, 1111001, etc. 96 Note that the primary centroid is in the same place as the secondary centroid with index 000. Moreover, thanks to such a design, the base station may support users with different implementations of the vector quantizers, e.g., varying number of VQ tiers. Thanks to the embedding of the codewords, all such situations will be supported.

The algorithm from "Quantization of channel state information in multiple antenna systems" is as follows:

For the case of a single receiver active at a time, we introduce a heuristic distortion metric which is expressed as $$\gamma_V(n;H) = \|D\hat{V}^H \hat{V}(n) - D\|_F \quad (1)$$

where $\hat{V}(n)$ is the nth entry in the predefined set of channel diagonalization matrices and $\|\cdot\|_F$ is the Frobenius norm. We omitted subscript entries j in (1) for the clarity of presentation.

We assume that $n=0, 1, \ldots 2^{N_V}-1$ where $N_V$ is the number of bits per channel realization in the feedback link needed to represent the vectors $\hat{V}(n)$. To design the quantizer using (1), we divide the whole space of channel realizations H into $2^{N_V}$ regions $V_i$ where $$V_i = \{H : \gamma_V(i;H) < \gamma_V(j;H) \text{ for all } j \neq i\}. \quad (2)$$

The algorithm starts by creating a codebook of centroids $\hat{V}$ and, based on these results divides the quantization space into regions $V_i$. The codebook is created as follows:
1. Create a large training set of L random matrices H(l).
2. For each random matrix H(l), perform singular value decomposition to obtain D(l) and V(l) as $$y_j = H_j x_j + n_j = (U_j D_j V_j^H)(V_j \tilde{x}_j) + n_j \quad (3)$$

3. Set iteration counter i=0. Create a set of $2^{N_V}$ random matrices $\hat{H}(n)$.
4. For each matrix $\hat{H}(n)$ calculate corresponding $\hat{V}^{(i)}(n)$ using singular value decomposition.
5. For each training element H(l) and codebook entry $\hat{V}^{(i)}(n)$ calculate the metric in (1). For every l choose indexes $n_{opt}(l)$ corresponding to the lowest values of $\gamma_V(n;H(l))$.
6. Calculate a new set $\hat{V}^{(i+1)}(n)$ as a form of spherical average of all entries V(l) corresponding to the same index n using the following method. (The direct averaging is impossible since it does not preserve orthogonality between eigenvectors.) For all n calculate the subsets $L(n) = \{l:n_{opt}(l)=n\}$ and if their respective cardinalities $|L(n)| \neq 0$ the corresponding matrices $\overline{Q}^{(i+1)}(n)$ can be obtained as $$\overline{Q}^{(i+1)}(n) = \frac{1}{|L(n)|} \sum_{l \in L(n)} V(l)^1 O V(l)^H \quad (4)$$

where $^1 O$ is an $n_T \times n_T$ all-zero matrix with the exception of the upper-left corner element equal to 1. Finally, using singular value decomposition, calculate $\hat{V}^{(i+1)}(n)$ from $$\overline{Q}^{(i+1)}(n) = \hat{V}^{(i+1)}(n) W (\hat{V}^{(i+1)}(n))^H \quad (5)$$

where W is a dummy variable.
7. Calculate the average distortion metric $\overline{\gamma}_V^{(i+1)} = 1/L \sum_l \gamma_V(n_{opt}(l);H(l))$.
8. If distortion metric fulfils $|\overline{\gamma}_V^{(i+1)} - \overline{\gamma}_V^{(i)}|/\overline{\gamma}_V^{(i)} < \Theta$, stop. Otherwise increase i by 1 and go to 5).

Upon completion of the above, algorithm, the set of vectors $\hat{V}$ can be used to calculate the regions in (2).

Having optimized power-independent entries in the codebook of channel eigenmode matrices $\hat{V}$, the next step is to create a codebook for power allocation $\hat{S}$. We use a distortion metric defined as $$\gamma_S(k;H;P) = \frac{\det[II + HQH^H]}{\det[II + H\hat{V}(n_{opt})\hat{S}(k)\hat{V}^H(n_{opt})H^H]} \quad (6)$$

where $\hat{S}(k)$ is the kth entry in the predefined set of channel water-filling matrices and $\hat{V}(n_{opt})$ is the entry in $\hat{V}$ codebook that minimizes metric (1) for the given H. We use $k=0, 1, \ldots 2^{N_S}-1$ where $N_S$ is the number of bits per channel realization in the feedback link needed to represent the vectors $\hat{S}(k)$. Minimizing the metric in (6) is equivalent to minimizing the capacity loss between the optimum water-filling using Q and the quantized water-filling using $\hat{V}$ and $\hat{S}$.

Similarly to the previous problem, we divide the whole space of channel realizations H into $2^{N_S}$ regions $S_i(P)$ where $$S_i(P) = \{H : \gamma_S(i;H;P) < \gamma_S(j;H;P) \text{ for all } j \neq i\}. \quad (7)$$

and to create the codebook $\hat{S}$, we use the following method:
1. Create a large training set of L random matrices H(l).
2. For each random matrix H(l), perform water-filling operation to obtain optimum covariance matrices Q(l) and S(l).
3. Set iteration counter i=0. Create a set of $2^{N_S}$ random diagonal matrices $\hat{S}^{(i)}(k)$ with $\text{Tr}(\hat{S}^{(i)}(k))=P$.
4. For every codebook entry $\hat{S}^{(i)}(k)$ and matrix Q(l), calculate the metric as in (6). Choose indexes $k_{opt}(l)$ corresponding to the lowest values of $\gamma_S(k;H(l);P)$.
5. If $\gamma_S(k_{opt}(l);H(l);P) > \gamma_{eq}(H(l);P)$ where $\gamma_{eq}(H(l);P)$ is the metric corresponding to equal-power distribution defined as $$\gamma_{eq}(H(l);P) = \frac{\det[II + H(l)Q(l)H^H(l)]}{\det[II + P/n_T H(l)H^H(l)]}, \quad (8)$$

set the corresponding entry $k_{opt}(l)=2^{N_S}$. For all k calculate the subsets $L(k) = \{l:k_{opt}(l)=k\}$.
6. For all $k=0, 1, \ldots 2^{N_S}-1$ for which $|L(k)| \neq 0$, calculate a new set $\hat{S}^{(i+1)}(k)$ as the arithmetic average $$\hat{S}^{(i+1)}(k) = \frac{1}{|L(k)|} \sum_{l \in L(k)} S(l). \quad (9)$$

7. Calculate the average distortion metric $$\overline{\gamma}_S^{(i+1)} = \frac{1}{L} \sum_l \min\{\gamma_S(k_{opt}(l); H(l); P), \gamma_{eq}(H(l); P)\}. \quad (10)$$

8. If distortion metric $|\overline{\gamma}_S^{(i+1)} - \overline{\gamma}_S^{(i)}|/\overline{\gamma}_S^{(i)} < \Theta$, stop. Otherwise increase i with 1 and go to 4).

The set of vectors $\hat{S}$ is then used to calculate the regions in (7). Since water-filling strongly depends, on the power level P and $\hat{V}$, optimally the $\hat{S}$ should be created for every power level and number of bits $N_V$ in eigenvector matrix codebook. (2).

In the multi-user case, we follow the approach of Spencer et al, where each user performs singular value decomposition of $H_k = U_k S_k V_k^H$ and converts its respective $H_k$ to a $n_T$-dimensional vector $h_k$ as $$h_k = u_k^H H_k = s_k^{max} v_k^H \quad (11)$$

where $s_k^{max}$ is the largest singular value of $S_k$ and $u_k$ and $v_k$ are its corresponding vectors from the unitary matrices $U_k$ and $V_k$, respectively.

We use the linear block diagonalization approach which eliminates MUI by composing the modulation matrix B[S] of properly chosen null-space eigenmodes for each set S. For each receiver i∈S, the ith row of the matrix. H[S] is first deleted to form H[S$_i$]. In the next step, the singular value decomposition is performed to yield $H[S_i]=U[S_i]S[S_i]V^H[S_i]$. By setting the ith column of B[S] to be equal to the rightmost vector of V[S$_i$] we force the signal to the ith receiver to be transmitted in the null-space of the other users and no MUI will appear. In other words, the channel will be diagonalized with $d_i$, being the entries on the diagonal of H[S]B[S]. This leads to formula $$R^{linear} = \max_S \sum_{i=1}^{n_T} [\log_2(\xi[S]d_i^2)]_+ \quad (12)$$

where $\xi[S]$ is the solution of the water-filling equation.

We assume that $N_v$ is the number of bits per than channel realization in the feedback link needed to represent the vectors $v_k$ in (11). We divide the space of all possible v's into $2^{N_v}$ regions $v_i$ $$v_i = \{v : \gamma_v(i;v) < \gamma_v(j;v) \text{ for all } j \neq i\} \quad (13)$$

where $\gamma_v(n;v)$ is a distortion function. Within each region $v_i$ we define a centroid vector $\hat{v}(i)$, which will be used as a representation of the region. The design of the codebook $\hat{v}$ can be done analytically and/or heuristically using for example the Lloyd algorithm. In this work, we define the distortion function as the angle between the actual vector v and $\hat{v}(i)$: $\gamma_v(i;v) = \cos^{-1}(\hat{v}(i) \cdot v)$, which has been shown by Roh and Rhao to maximize ergodic capacity, and use Lloyd algorithm to train the vector quantizer. Note that the construction of $\hat{v}$ is independent of the transmit power.

We assume that $N_s$ is the number of bits per channel realization in the feedback link needed to represent the scalar $s_k^{max}$ in (11). We divide the space of all possible channel realizations $s = s^{max}$ into $2^{N_s}$ regions $s_j$ $$s_i = \{s : |\hat{s}(i) - s| < |\hat{s}(j) - s| \text{ for all } j \neq i\} \quad (14)$$

where $\hat{s}(i)$ are scalar centroids representing regions $s_i$. In this work, we perform the design of the codebook $\hat{s}$ using the classical non-uniform quantizer design algorithm with distortion function given by quadratic function of the quantization error as $\epsilon(i;s) = (s - \hat{s}(i))^2$.

The construction of the codebook $\hat{s}$ is generally dependent on the transmit power level. However, the differences between the codebooks $\hat{s}$ for different power regions are quite small. This allows us to create only one codebook $\hat{s}$ and use it tar all transmit powers.

The calculation of the modulation matrix $\hat{B}$ is based on the given codebook $\hat{v}$. We assume that the quantization of the channel eigenmodes is performed at the receiver side and each user transmits back its codebook index $i_k$. The indices are then used at the transmitter side to select the modulation matrix $\hat{B}(i_1, i_2, \ldots i_K)$. Since, from the linear transmitter point of view, ordering of the users is not important, we use the convention that the indices $(i_1, i_2, \ldots i_K)$ are always presented in the ascending order. For example, in a system with K=2, $n_T=2$ and 1-bit vector quantizers $\hat{v}$, there will exist only three possible modulation matrices corresponding to sets of $\hat{v}$ indices (1, 1), (1, 2) and (2, 2).

In the context of vector quantizing, the design of the modulation matrices can no longer be based on the algorithm presented for the single user case. Using this method with quantized versions of $h_k$ produces wrong result when identical indices $i_k$ are returned and the receiver attempts to jointly optimize transmission to the users with seemingly identical channel vectors $\hat{h}_k$. Instead, we propose the following algorithm to optimize the set of matrices $\hat{B}(i_1, i_2, \ldots i_K)$:

1. Create a large set of $Nn_T$ random matrices $H_k$, where N is the number of training, sets with $n_T$ users each.
2. For each random matrix $H_k$, perform singular value decomposition and obtain $h_k$ as in (11).
3. For each vector $h_k$ store the index $i_k$ of the corresponding entry $\hat{v}(i_k)$.
4. Divide the entire set of matrices $H_k$ into N sets with $n_T$ elements each.
5. Sort the indices $i_k$ within each set l in the ascending order. Map all unique sets of sorted indices to a set of unique indices $I_B$ (for example (1,1)→$I_B$=1; (1,2)→$I_B$=2; (2,2)→$I_B$=3 . . . ).
6. In each set l, reorder the corresponding channel vectors $h_k$ according to their indices $i_k$ and calculate the optimum $B_l$ using the block diagonalization method described above.
7. Calculate a set $\hat{B}(I_B)$ as a column-wise spherical average of all entries $B_l$ corresponding to the same index $I_B$.

After calculation of $|I_B|$ modulation matrices $\hat{B}$, the remaining part of system design is the calculation of the water-filling matrices $\hat{D}$, which divide the powers between the eigenmodes at the transmitter. The procedure for creation of codebook $\hat{D}$ is similar to the above algorithm, with the difference that the entries $\hat{s}(n_k)$ are used instead of $\hat{v}(i_k)$, and the spherical averaging of the water-filling matrices is performed diagonally, not column-wise. Explicitly:

1. Create a large set of $Nn_T$ random matrices $H_k$, where N is the number of training sets with $n_T$ users each.
2. For each random matrix $H_k$, perform singular value decomposition and obtain $h_k$ as in (11).
3. For each vector $h_k$ store the index $n_k$ of the corresponding entry $\hat{s}(n_k)$.
4. Divide the entire set of matrices $H_k$ into N sets with $n_T$ elements each.
5. Sort the indices $n_k$ within each set 1 in the ascending order. Map all unique sets of sorted indices to a set of unique indices $I_D$ (for example (1,1)→$I_D$=1; (1,2)→$I_D$=2; (2,2)→$I_D$=3 . . . ).
6. In each set l, reorder the corresponding channel vectors $h_k$ according to their indices $n_k$ and calculate the optimum $D_l$ using the method of waterfilling of (12).
7. Calculate a set $\hat{D}(I_D)$ as a diagonal spherical average of all entries $D_l$ corresponding to the same index $I_D$.

Figure 7:
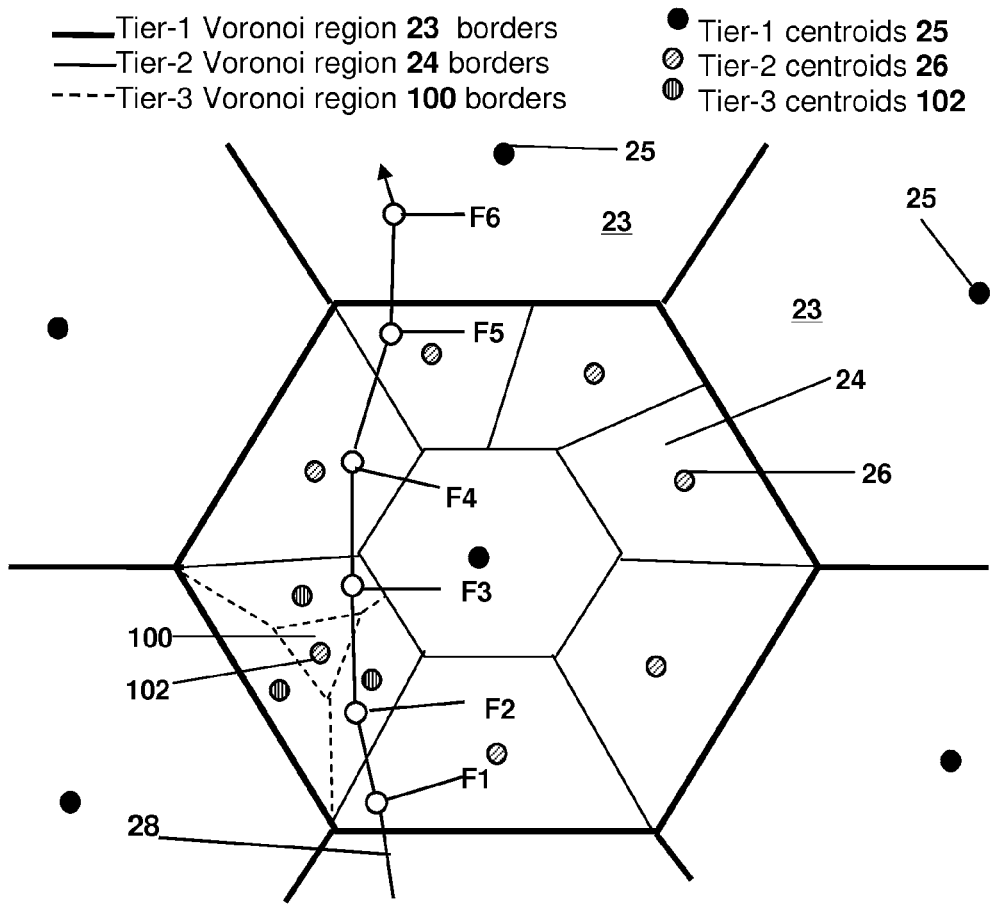
FIG. 7 shows an example of the operation of a multi-tiered quantizer.
Figure 8:
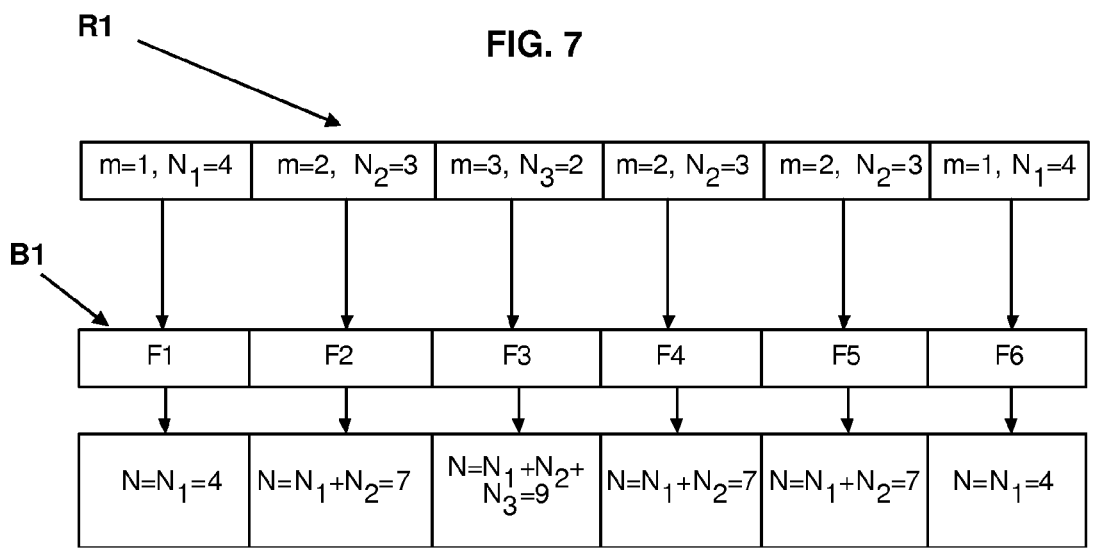
FIG. 8 is a flow diagram showing the operation of a multi-tiered quantizer.

Referring to FIGS. 7 and 8, based on the design of the multi-tiered codebooks D and V as in the previous section, the system will operate as follows:

1. Initialize transmission epoch to t=1.
2. Set $m_k$=1 at each receiver k, (all users will use separate indices $m_k$) (step 112).
3. Set $m^k$=1 separately for each receiver at the transmitter side. The transmitter-side indices $m^k$ should be mapped to their respective receiver-side indices $m_k$ (step 110).
4. Each receiver estimates its channel matrix H[t] (step 40).
5. Each receiver performs the vector quantization of the channel using m=1 tier quantizers described above (step 114).
6. The m-tier $N_m$-bit long indices are fed back to the transmitter.

7. The transmitter performs the selection of active users using any method (maximum fairness, maximum throughput etc.) and chooses the optimum modulation matrices using a VQ method such as the method described in U.S. patent application Ser. No. 11/754,965.
8. The signal is transmitted to the selected active receivers.
9. Increase transmission epoch as t=t+1.
10. Each receiver estimates its channel matrix H[t] (step 40).
11. Each receiver performs the vector quantization of the channel using m-tier quantizers described above (step 114).
12. Each receiver that recognizes (step 116) that its quantized channel's $m_k$-tier Voronoi region in the t+1 epoch is identical to the $m_k$-tier Voronoi region in epoch t performs the following steps:
    a) Unless 118 $m_k$=M, increase the receiver's index to $m_k$=$m_k$+1 (step 120).
    b) The channel realization within the unchanged Voronoi region is quantized using the new $m_k$-tier quantizer (step 114).
    c) The receiver uses a known mechanism (see later in the document) to signal to the transmitter the new $m_k$-tier of VQ.
    d) The $N_{mk}$ bits long indices are fed back to the transmitter (step 124).
    e) Transmitter increases its index as $m^k$=$m^k$+1 (step 126).
13. Each receiver that recognizes (step 116) that its quantized channel's $m_k$-tier Voronoi region in the t+1 epoch is not identical to the $m_k$-tier Voronoi region in epoch t performs the following steps:
    a) Unless (step 128) $m_k$=1, decrease the receiver's index $m_k$ to the last tier where the Voronoi regions $m_{k-1}$ are identical in both t and t+1 epochs (step 130).
    b) If no such tier can be found, set $m_k$=1, otherwise update the $m_k$ to a value for which Voronoi regions $m_{k-1}$ are identical (step 130).
    c) The channel realization is quantized using the $m_k$-tier quantizer (step 114).
    d) The receiver uses a known mechanism (see below) to signal to the transmitter the new $m_k$ tier of VQ.
    e) The $N_{mk}$ bits long indices are fed back to the transmitter (step 124).
    f) Transmitter decreases its index as $m^k$=$m_k$ (step 134).
14. The transmitter selects the modulation matrices based on the indices fed from the receivers and each receiver's separate $m^k$ index stored at the transmitter side (step 136).
15. The modulation matrices are used to transmit the information to the selected receivers (step 138).

The example of the algorithm's operation shown in FIGS. 7-8 for one mobile receiver uses M=3 tiered quantizer. In this scenario, CSI vector stays in tier-1 Voronoi region 20 in first 5 frames F1-F5, in the tier-2 region 24 in first 5 frames F1-F5, and tier-3 region 100 in frames F2 and F3. Receiver R1 recognizes the subsequent Voronoi regions and adjusts the tier (m) 104 of the used quantizer accordingly by increasing and decreasing quantizer resolution. The quantizer indices each representing the centroid 22,26,102 of its respective Voronoi region in the appropriate tier, are then fed to the base station B1 that combines them properly so that the effective CSI resolution N varies in time (t increases from F1-F6) depending on the rate of channel changes. Base station B1 chooses modulation matrix 56 and transmits signal 60. At each time the resolution is equal to that of an untiered quantizer with a number of bits equal to the number of bits 106 representing the tier used ($N_m$) plus that for all lower tiers. It can be clearly seen that the proposed algorithm allows the system to automatically adjust the resolution to the speed of channel changes.

Figure 9:
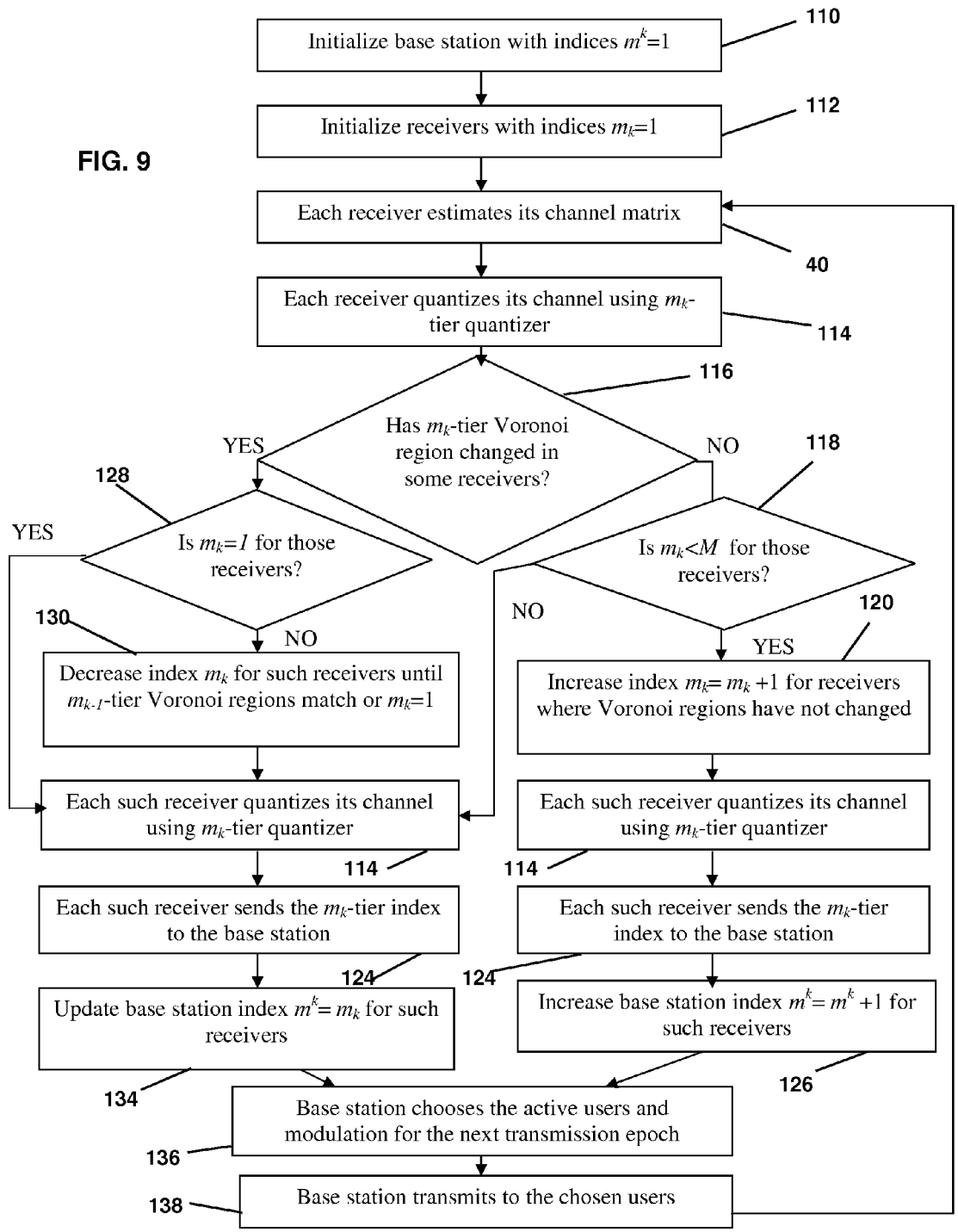
FIG. 9 shows the operation of the quantizer.

FIG. 9 shows a graphical representation of the algorithm.

The set of indices $m_k$ at the receivers should be matched to the indices $m^k$ at the transmitter. If the transmitter uses the index $m^k$ that corresponds to the wrong $m_k$-tier of the receiver VQ, the resulting loss of performance may be very significant. In general, the index of the quantized channel vector at the transmitter is reconstructed as:

AAAABBBCCC . . . .

where AAAA corresponds to m=1 tier $N_1$ indexing bits, BBB corresponds to m=2 tier $N_2$ indexing bits etc. (see FIG. 6 for an example).

At any given time, the transmitter receives only m-tier index bits (AAAA, BBB, CCC etc.) and it must be able to establish which tier those bits correspond to. For example, there must be a signaling method allowing the transmitter to distinguish between two consecutive transmissions such as BBB, BBB where the channel vector moved away from one tier-2 centroid to another, from the BBB, CCC transmission, where the channel vector stayed in the same tier-2 region BBB and tier-3 quantization was used in the CCC word.

Various methods may be used for transmitting index information from the receiver to the transmitter such as:
1. Direct indexing of VQ words. In order to let the transmitter know, which VQ tier is used, the actual VQ codeword index is extended with the bit representation of the index $m_k$ of each receiver. Example:

MMAAAA, MMBBB, MMCCC . . . .

Where, for example, two bits MM are used to represent one of the four quantization tiers in the system. The drawback of this method is that the additional feedback load is required to transmit information about $m_k$ indices.

2. Varying length of different m tier VQ words. In this method, each m-tier of the CSI quantizer is characterized by different number of indexing bits $N_m$. Example:

AAAA, BBB, CC, D . . . .

where four bits AAA are used to represent tier-1 quantization, 3 bits BBB are used to represent tier-2 quantization etc. The advantage of this system is that there is no need to transmit additional bits M as in the previous method. The drawback of this method is that there must be another mechanism allowing the transmitter to count how many bits were actually sent from the receiver and the varying feedback load.

3. Channel prediction based assessment of VQ tier. In this method, each m-tier of the CSI quantizer may be characterized by any number of bits $N_m$ and the statistical channel characterization is used by the transmitter to decide whether the channel vector stayed in the previous m-tier Voronoi region or moved away from it. The advantage of this system is that it leaves a large degree of freedom for designing the feedback link. The drawback of this method is that the complexity of transmitter design grows and there may be erroneous decisions on the tier of quantizer used by the receivers.

4. Hybrid solutions combining the previous three methods in any way that is suitable from system design point of view.

In the course of the system operation, it may happen that some of the transmitter indices $M^k$ will no longer be synchronized with corresponding receiver indices $m_k$. Such a situation will typically happen when one of the feedback messages from a receiver has not been detected at the transmitter (i.e., the transmitter lacks channel quantization index for the current transmission epoch) or the received message with the indexing information does not agree with the expected quantization tier m.

In practical communication systems, two erroneous situations can occur:
  The received feedback message shows the situation when $m_k > m^k + 1$. Such a situation is not allowed during the course of the normal operation since the receiver may only step back to the lower tier quantizers or increase the current one by 1.
  The transmitter did not receive any feedback information due to the feedback link problems.

Various methods may be used to solve the problem such as:
1. Use channel prediction to recover the incorrect index. The previously used indices are used to extrapolate the actual channel information index.
2. Deactivate the user for the next transmission epoch and send the VQ RESET message to it. If the transmitter cannot reliably decide, which channel index was reported by the receiver, it sends a special VQ RESET message to the receiver containing the last value of the effective index at the transmitter AAAABBBCC . . . without the last tier of bits (in other words, bits up to the level $m^k-1$ are communicated to the base station). The receiver than establishes, whether the same tier of the VQ can be used or whether it has to step back to a lower tier. The new indices are sent to the transmitter and the system resumes the usual operation.

Figure 10:
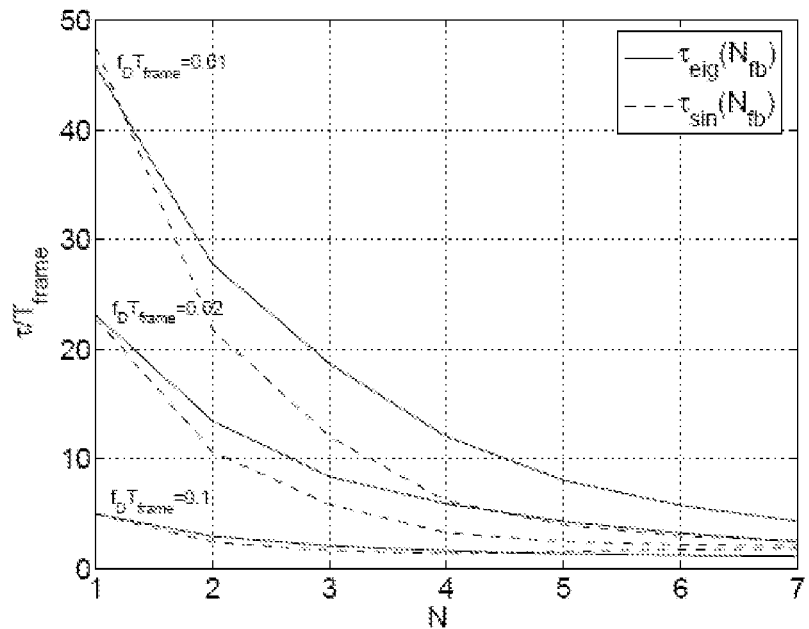
FIG. 10 shows typical eigenmode and singular value coherence times.

FIG. 10 shows a typical set of curves representing the eigenmode and singular value coherence times for a 2×2 MIMO system. For definitions see B. Mielczarek and W. Krzymien, "Influence of CSI feedback delay on capacity of linear multi-user MIMO systems," in Proc. IEEE WCNC., Hong Kong, March 2007, pp. 1188-1192. As one can see, the length of time in which the first tier Voronoi regions do not change decreases with increasing resolution and normalized Doppler frequency of the channel $f_D T_{frame}$. For example, with $f_D T_{frame} = 0.02$, the Voronoi regions of the eigenmode quantizers will stay the same for approximately 6 consecutive frames when the eigenmode quantizer uses N=4 bit resolution. When the quantizer uses N=7 bits, only 2-3 consecutive frames will have identical first tier Voronoi regions. In general, in order to improve system's throughput, it is preferable to use higher resolution of VQ but the price for the improvement is the high feedback burden and frequent changes of the high resolution indices. As shown in example below, by using a multi-tier VQ design, it is actually possible to achieve very good system performance and significantly reduce the required feedback bit rate.

Figure 11:
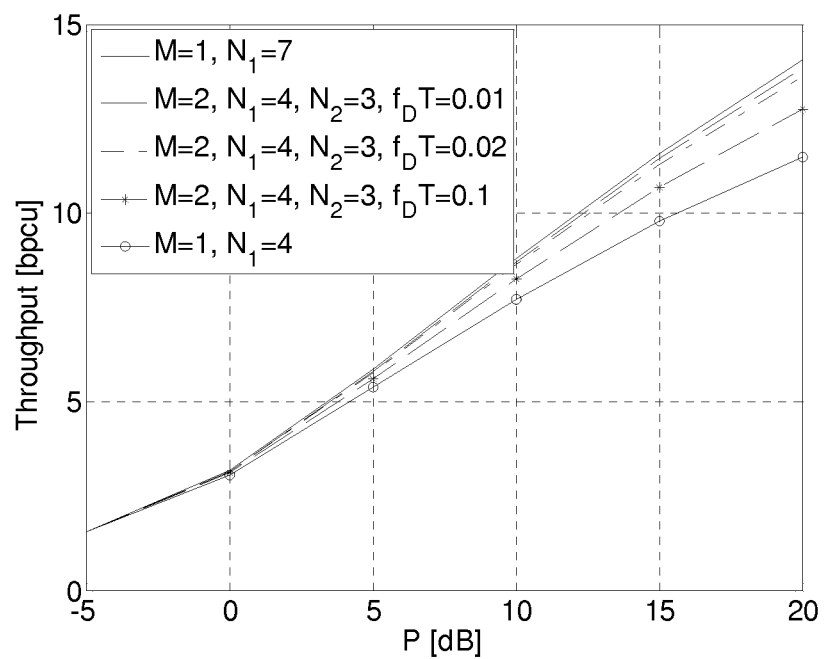
FIG. 11 shows the results of a simulation comparing a multi-tiered quantizer with non-tiered quantizers.

In FIG. 11, the simulation results are shown for a system with 2-tier eigenmode quantizer (M=2) using $N_1=4$ and $N_2=3$. The system has been designed using algorithms described in this application and starts by transmitting 4 bits (AAAA) and, if the 1-tier Voronoi regions are the same in the consecutive frames, only 3 bits (BBB) are sent to the transmitter. We compare them with 1-tier systems with $N_1=7$ and $N_1=4$. The implemented algorithms are tested on a system with 2 base station antennas and 10 users with 2 receive antennas each. We test three channels with maximum normalized Doppler frequencies equal to 0.01, 0.02 and 0.1 as in FIG. 11. As one can see, the throughput gap between the conventional 1-tier vector quantizers for $N_1=7$ and $N_1=4$ is quite large (around 3 dB at 10 bpcu)—any increase of throughput in such simple systems requires increase of feedback bandwidth. However, if the channel is assumed to have memory, by using our proposed approach, it is possible to attain almost the same performance with multi-tier CSI quantization. In our example, the maximum feedback burden is set to 4 bits/frame/receiver for the 2-tier system but the performance is almost equivalent to 7 bit feedback system for a large range of Doppler frequencies. Hence, by proper choice of the number of tiers and their corresponding resolutions, it is possible to design the practical systems for a wide variety of channel conditions, required throughput performance and maximum feedback link bit rates.

In the claims, the word "comprising" is used in its inclusive sense and does not exclude other elements being present. The indefinite article "a" before a claim feature does not exclude more than one of the feature being present. Each one of the individual features described here may be used in one or more embodiments and is not, by virtue only of being described here, to be construed as essential to all embodiments as defined by the claims.

Immaterial modifications may be made to the embodiments described here without departing from what is covered by the claims.

What is claimed is:

1. An apparatus for quantizing channel state information in a multiple-input transmission system having at least a transmitter and a receiver, the apparatus comprising:
  first quantizing means for quantizing information concerning a first channel state to produce first quantized information, and sending the first quantized information to the transmitter; and
  second quantizing means for quantizing information concerning a second channel state by reference to (1) the second channel state and (2) the first quantized information, to produce second quantized information, and sending the second quantized information to the transmitter.

2. An apparatus comprising:
  a transmitter comprising antennas; and
  a receiver comprising at least one antenna and a processing module configured to quantize information concerning a first channel state to produce first quantized channel state information, send the first quantized channel state information to the transmitter, quantize information concerning a second channel state by reference to (1) the second channel state and (2) the first quantized channel state information to produce second quantized channel state information, and send the second quantized channel state information to the transmitter,
  wherein the transmitter is configured to process the quantized channel state information from one or more receivers and modulate a signal sent to one or more of the receivers in accordance with the quantized channel state information.

3. The apparatus of claim 2 wherein the quantization of the first channel state and the quantization of the second channel state are each carried out using a codebook, the codebook having codebook entries each representing a region of a space of possible channel states, the quantization comprising representing each channel state with a codebook entry that represents a region of the space of possible channel states, which includes the channel state, and transmitting a codeword index representing the codebook entry.

4. The apparatus of claim 3 wherein a single codebook is used to quantize the first channel state and the second channel state, the codebook entries of the codebook being arranged in multiple tiers.

5. The apparatus of claim 4 wherein:
  the codebook has a lowest tier, and for any tier other than the lowest tier, the codebook entries in each respective tier are arranged in groups, so that each such group is associated with one or more codebook entries in a lower tier; and each codebook entry in each tier other than the lowest tier is represented by an index which is unique among the codebook entries in that group.

6. The apparatus of claim 4 wherein if (1) the codebook entry used to represent the first channel state is in an initial tier, (2) at least one group of codebook entries in a tier higher than the initial tier has a property that the one or more codebook entries associated with the group includes the codebook entry used to represent the first channel state, and (3) the one or more codebook entries associated with the group also includes an entry in the initial tier that represents a region of the space of possible channel states that includes the second channel state, then the second channel state is quantized using one of the at least one group of higher tier codebook entries with that property.

7. The apparatus of claim 5 wherein each group of codebook entries in any tier other than the lowest tier is uniquely associated with a single codebook entry in a lower tier.

8. The apparatus of claim 7 wherein if the first channel state is quantized using a first codebook entry, and the second channel state is not in the region of the space of possible channel states represented by that codebook entry, then a codebook entry which represents a region of the space of possible channels states containing both channel states is used, the codebook entry being in the highest tier that has a codebook entry which represents a region of the space of possible channel states containing both states.

9. The apparatus of claim 7 wherein if the first channel state is quantized using a first codebook entry in a first group of codebook entries, and the second channel state is not in any of the regions of the space of possible channel states represented by each of the codebook entries in the group of codebook entries, then the second channel state is quantized using a codebook entry in a group of codebook entries in which the first channel state is in a region of the space of possible channel states represented by one of the codebook entries in the group, and the second channels state is also in a region of the space of possible channel states represented by one of the entries in the group, and if more than one such group exists, a group in the highest tier containing such groups is used, and if no such group exists, a codebook entry in the lowest tier is used to quantize the second channel state.

10. The apparatus of claim 5 wherein the regions of the space of possible channel states corresponding to codebook entries in each group of each tier other than the lowest tier, and codebook entries in the lowest tier, are Voronoi regions for some choice of centroids and a metric.

11. The apparatus of claim 10 wherein centroids for a lower tier correspond to a subset of centroids for a higher tier.

12. The apparatus of claim 4 wherein information concerning which tier the codebook entry used to quantize the second channel state belongs to is transmitted with the codeword indices.

13. The apparatus of claim 4 wherein information concerning which tier the codebook entry used to quantize the second channel state belongs to is transmitted by using codewords varying in length according to the tier being used.

14. The apparatus of claim 4 wherein channel prediction is used to predict which tier the codebook entry used to quantize the second channel state belongs to.

15. The apparatus of claim 4 wherein channel prediction is used to recover from synchronization error or missing information concerning to which tier the codebook entry used to quantize the second channel state belongs.

16. The apparatus of claim 4 wherein in order to recover from a synchronization error or missing information concerning to which tier the codebook entry used to quantize the second channel state belongs, the transmitter sends a request to do another quantization in a way not directly depending on the missing or erroneous quantization.

17. The apparatus of claim 16 wherein the transmitter includes information concerning what to use as the first quantized information with the request.

18. The apparatus of claim 6, wherein the processing module is further configured to construct a single-tiered codebook to be used as a lowest tier of a multiple tier codebook,
wherein for each entry in the lowest tier, the processing module is configured to select a region of a space of possible channel states, construct a finer codebook to quantize the region of the space of possible channel states, and use the entries of the finer codebook as a group of entries in a second tier associated with the entry of the lowest tier; and
if more tiers are desired, the processing module is configured to construct further tiers in relation to the second tier in the same way as the second tier is constructed in relation to the first tier.

19. The apparatus of claim 18 wherein the region of the space of possible channel states that is used to construct the group of entries of the next tier is the same as the region of the space of possible channel states represented by the entry.

20. The apparatus of claim 19 wherein the regions of the space of possible channel states represented by each entry of the codebook are Voronoi regions and each group of entries in each higher tier is forced to have a centroid of one of the Voronoi regions co-located with a centroid of the region represented by the lower tier entry with which it is associated.

21. An apparatus for transmitting quantized channel state information in a multiple-input transmission system, comprising:
a transmitter;
a receiver configured to receive a channel and determine channel state information for said channel; and
a quantizer coupled in signal communication between the receiver and the transmitter, the quantizer configured to:
quantize the channel state information for a first channel state to produce first quantized feedback information, and send the first quantized feedback information to the transmitter,
separate the channel state information into a modulation stream and a power-related stream, and
quantize said modulation stream and said power-related stream using independent multi-tiered codebooks, respectively.

22. An apparatus as defined in claim 21 wherein the quantizer is further configured to quantize the channel state information for a second channel state relative to the first quantized feedback information to produce second quantized feedback information, and send the second quantized feedback information to the transmitter.

23. An apparatus as defined in claim 21 wherein the receiver is further configured to adjust a resolution of the channel state information based on characteristics of the channel.

24. An apparatus as defined in claim 21, further comprising a plurality of receivers that may each use different resolutions for determining their respective channel state information.

25. A receiver for receiving from a multiple-input transmission system, the multiple-input transmission system having a transmitter with multiple antenna, the transmitter being configured to transmit according to channel state information quantized at the receiver and sent to the transmitter, the receiver comprising:
  one or more antennas; and
  a processing module configured to detect channel state information of a channel between the one or more antennas of the receiver and the multiple antennas of the transmitter, the processing module being configured to quantize information concerning a first channel state of the channel to produce first quantized information, and to send the first quantized information to the transmitter, the processing module also being configured to quantize information concerning a second channel state of the channel by reference to (1) the second channel state and (2) the first quantized information to produce second quantized information, and to send the second quantized information to the transmitter.

26. A multiple-input transmission system comprising:
  a transmitter, the transmitter having multiple antennas and a transmitter processing module;
  a receive for receiving from the transmitter, the receiver having one or more antennas and a receiver processing module, the receiver processing module being configured to detect channel state information of a channel between the one or more antennas of the receiver and the multiple antennas of the transmitter, the receiver processing module being configured to quantize information concerning a first channel state of the channel to produce first quantized information, and to send the first quantized information to the transmitter, the processing module also being configured to quantize information concerning a second channel state of the channel by reference to (1) the second channel state and (2) the first quantized information to produce second quantized information, and to send the second quantized information tot eh transmitter; and
  the transmitter processing module being configured to receive the first quantized information and the second quantized information from the receiver and to transmit a signal to the receiver using the multiple antennas of the transmitter, modulating the signal according to the first quantized information and the second quantized information.

27. The multiple-input transmission system of claim 26 in which each of the receiver and the transmitter is a transceiver.

28. A transceiver for a multiple-input transmission system having at least another receiver having one or more antennas and at least another transmitter having multiple antennas, the at least another transmitter being configured to transmit according to channel state information quantized at the transceiver and sent to the transmitter, the at least another receiver being configured to detect channel state information of a transmit channel between plural antennas of the transceiver and the one or more antennas of the at least another receiver, and to quantize information concerning a first transmit channel state of the transmit channel to produce first transmit quantized information, and to send the first transmit quantized information to the transceiver, the at least another receiver also being configured to quantize information concerning a second transmit channel state of the transmit channel by reference to (1) the second transmit channel state and (2) the first transmit quantized information to produce second transmit quantized information, and to send the second transmit quantized information to the transceiver, the transceiver comprising:
  multiple antennas; and
  a processing module configured to receive the first transmit quantized information and the second transmit quantized information from the at least another receiver and to transmit a signal to the receiver using the multiple antennas, modulating the signal according to the first transmit quantized information and the second transmit quantized information, the processing module also being configured to detect channel state information of a receive channel between one or more of the multiple antennas of the transceiver and the multiple antennas of the transmitter, the processing module being configured to quantize information concerning a first receive channel state of the receive channel to produce first receive quantized information, and to send the first receive quantized information to the transmitter, the processing module also being configured to quantize information concerning a second receive channel state of the receive channel by reference to (1) the second receive channel state and (2) the first receive quantized information to produce second receive quantized information, and to send the second receive quantized information to the transmitter.

29. The transceiver of claim 28 in which the plural antennas of the transceiver used for the transmit channel does not include any of the one or more channels of the transceiver used for the receive channel.

30. The transceiver of claim 28 in which the processing module comprises at least a first processing module and a second processing module, the first processing module being configured to receive the first transmit quantized information and the second transmit quantized information from the at least another receiver and to transmit a signal to the receiver using the multiple antennas, modulating the signal according to the first transmit quantized information and the second transmit quantized information, and the second processing module being configured to detect the channel state information of the receive channel between one or more of the multiple antennas of the transceiver and the multiple antennas of the transmitter, the second processing module being configured to quantize information concerning the first receive channel state of the receive channel to produce the first receive quantized information, and to send the first receive quantized information to the transmitter, the processing module also being configured to quantize information concerning the second receive channel state of the receive channel by reference to (1) the second receive channel state and (2) the first receive quantized information to produce the second receive quantized information, and to send the second receive quantized information to the transmitter.

31. An apparatus for transmitting quantized channel state information in a multiple-input transmission system, comprising:
  a transmitter;
  a plurality of receivers each configured to receive a respective channel and use different resolutions for determining their respective channel state information for said respective channel; and
  a quantizer coupled in signal communication between the receiver and the transmitter, the quantizer configured to:
    quantize first channel state information for a first channel state to produce first quantized feedback information, and send the first quantized feedback information to the transmitter.

32. An apparatus as defined in claim 31 wherein the quantizer is further configured to quantize second channel state information for a second channel state relative to the first quantized feedback information to produce second quantized feedback information, and send the second quantized feedback information to the transmitter.

33. An apparatus as defined in claim 31 wherein a receiver of the plurality of receivers is further configured to adjust a resolution of its respective channel state information based on characteristics of the respective channel.

34. An apparatus as defined in claim 31 wherein the quantizer is further configured to separate the first channel state information into a modulation stream and a power-related stream, and quantize said modulation stream and said power-related stream using independent multi-tiered codebooks, respectively.

* * * * *

UNITED STATES PATENT AND TRADEMARK OFFICE
CERTIFICATE OF CORRECTION

PATENT NO. : 9,048,891 B2  
APPLICATION NO. : 13/083375  
DATED : June 2, 2015  
INVENTOR(S) : Bartosz Mielczarek et al.

Page 1 of 1

It is certified that error appears in the above-identified patent and that said Letters Patent is hereby corrected as shown below:

IN THE CLAIMS

In claim 26, at column 15, line 22, before "the receiver", delete "a receive for receiving from the transmitter," and insert therefor --a receiver for receiving from the transmitter,--.

In claim 26, at column 15, line 38, after "tion", delete "tot he transmitter; and" and insert therefor --to the transmitter; and--.

Signed and Sealed this  
Twenty-ninth Day of December, 2015

Michelle K. Lee  
*Director of the United States Patent and Trademark Office*